United States Patent [19]

Okutani et al.

[11] Patent Number: 5,091,643
[45] Date of Patent: Feb. 25, 1992

[54] ABSOLUTE POSITION DETECTING METHOD AND APPARATUS THEREFOR

[75] Inventors: Norio Okutani, Neyagawa; Yutaka Masuda, Hirakata, both of Japan

[73] Assignee: Matsushita Electric Industrial Co., Ltd., Osaka, Japan

[21] Appl. No.: 561,380

[22] Filed: Jul. 31, 1990

Related U.S. Application Data

[63] Continuation of Ser. No. 182,424, Apr. 10, 1988, abandoned.

[30] Foreign Application Priority Data

Apr. 21, 1987 [JP] Japan ................... 62-97823

[51] Int. Cl.$^5$ ................................ G01D 5/34
[52] U.S. Cl. ......................... 250/231.14; 250/231.16; 341/13
[58] Field of Search ........ 250/231 SE, 237 G, 231.18, 250/231.16; 341/13, 14

[56] References Cited

U.S. PATENT DOCUMENTS

| 4,443,788 | 4/1984 | Breslow | 250/231 SE |
| 4,465,928 | 8/1984 | Breslow | 250/231 SE |
| 4,621,256 | 11/1986 | Rusk | 341/13 |
| 4,654,636 | 3/1987 | Rusk | 250/231 SE |

FOREIGN PATENT DOCUMENTS

| 2333698 | 9/1974 | Fed. Rep. of Germany . |
| 61-189415 | 8/1986 | Japan . |
| 8606895 | 11/1986 | PCT Int'l Appl. . |
| 1048924 | 11/1966 | United Kingdom . |

Primary Examiner—David C. Nelms
Attorney, Agent, or Firm—Stevens, Davis, Miller & Mosher

[57] ABSTRACT

A method and apparatus for simultaneously detecting and comparing a plurality of upper patterns indicative of Gray code patterns and having greater pattern pitches and a plurality of lower patterns indicative of pure binary code patterns and having smaller pattern pitches to correct the upper pattern detection data and thereby detect an absolute position. An absolute position detecting apparatus includes a code plate formed with a plurality of upper patterns and a plurality of lower patterns which are arranged radially along the periphery of a rotating body; a mask arranged at a position opposite to the code disc and having a plurality of upper slits and a plurality of first slits and a plurality of second slits which are formed to correspond to the lower patterns and having a 90-degree phase difference therebetween; a laser light source arranged at a position on the opposite side of the code plate to the mask to illuminate the code plate to form pattern projection images on the mask; a light detector for detecting the pattern projection images to detect positional alignment between the patterns and the slits; and data processing circuit for correcting detected data of the upper patterns by referring to those of the lower patterns.

14 Claims, 8 Drawing Sheets

⌒ EQUALITY
⌒ ̄ ̄ UNEQUALITY

| Ho | Go | Go' | Ho' | | CONDITIONS | PROCESSING |
|---|---|---|---|---|---|---|
| 0 | 0 | 0 | — | — | $Ho = 0$ $Go = Go'$ | $G_1 = Go$ |
| 0 | 1 | 1 | — | — | | |
| 0 | 0 | 1 | 1 | a | $Ho = 0$ $Go \neq Go'$ $Ho \neq Ho'$ | $G_1 = Go$ |
| 0 | 1 | 0 | 1 | b | | |
| 0 | 1 | 0 | 0 | c | $Ho = 0$ $Go \neq Go'$ $Ho = Ho'$ | $G_1 = \overline{Go}$ |
| 0 | 0 | 1 | 0 | d | | |
| 1 | 0 | 1 | — | — | $Ho = 1$ $Go \neq Go'$ | $G_1 = Go$ |
| 1 | 1 | 0 | — | — | | |
| 1 | 1 | 1 | 0 | e | $Ho = 1$ $Go = Go'$ $Ho \neq Ho'$ | $G_1 = \overline{Go}$ |
| 1 | 0 | 0 | 0 | f | | |
| 1 | 0 | 0 | 1 | g | $Ho = 1$ $Go \neq Go'$ $Ho = Ho'$ | $G_1 = Go$ |
| 1 | 1 | 1 | 1 | h | | |

ABSOLUTE POSITION DETECTING METHOD AND APPARATUS THEREFOR

This application is a continuation of application Ser. No. 182,424, filed Apr. 18, 1988, now abandoned.

BACKGROUND OF THE INVENTION

The present invention relates to an absolute position detecting method and an apparatus therefor.

Conventional absolute-type encoders capable of detecting an absolute position generally include a light source, a code plate having binary code patterns formed on a plurality of tracks arranged along the direction of movement and a plurality of photosensors arranged in correspondence to the tracks, thereby detecting the output signals of the photosensors to determine the position of the code plate. Also, the binary code patterns include pure binary code patterns capable of producing binary number position data and Gray code patterns designed so that the binary code patterns of different orders or position differ in boundary position from one another so as to prevent the position data from being disturbed considerably due to minor forming errors among the binary code patterns of different orders.

In addition, there has been known another absolute-type encoder employing a combination of a detection method using the previously mentioned binary code patterns and an incremental-type detection method so that a rough absolute position within a given detection range is detected by means of the binary code patterns and its infinitesimal position within the detection range is detected from a reference position established within the detection range by the incremental method.

Also, there has been known by JP-A-61-189415 an absolute position detecting apparatus including an absolute position detector using binary code patterns and a high-resolution detector for detecting its position within a minimum detection range by phase division.

Then, with the position detecting method employing the binary code patterns, while the detection of an absolute position can be effected digitally so that it is not liable to suffer the effect of vibration or noise and the position detection is effected with a high degree of accuracy, to effect a high-resolution position detection requires that the binary code patterns of varying orders themselves must be formed with a very high degree of accuracy and also the relative positions of these varying-order binary code patterns must be determined with a very high degree of accuracy. In the case of the previously mentioned pure binary code patterns, the relative positions of the binary code patterns of varying orders must be in complete coincidence, and also in the case of the Gray code patterns, all the binary code patterns of varying orders must be in coincidence with an accuracy of one fourth the bits in the lowest-order binary code pattern. Thus, these systems have disadvantages in that the forming accuracy of the patterns and the interpattern forming accuracy must be so high that position detection with a high resolution on the order of $2^{15}$ to $2^{20}$ cannot be realized due to technical manufacturing difficulties except special cases where huge costs, resulting from the initial manufacturing requirements, can be borne. Another disadvantage exists in that to maintain a high degree of signal detection accuracy for all the orders requires complicated signal processing capability thus increasing costs and making the provision of high speed response difficult.

Also, while the system combining the position detecting method employing binary code patterns and the incremental-type position detecting method has the effect of requiring relatively small numbers of patterns and photosensors thus making it possible to inexpensively effect a high accuracy position detection, there is a disadvantage in that it is necessary to perform the operation of detecting a rough position by means of the binary code patterns, searching a reference signal pattern to detect the reference position established in its detection range and incrementally detect the amount of displacement from the reference position to a position to be detected and that this operation is complicated thus decreasing the response speed.

In the case of a system simply combining the absolute position detector and a high-resolution detector by phase division, there is not only a disadvantage in that an increase in the detection range results in an increase in the slit pitch of the high-resolution detector thus causing a deterioration in the detection accuracy by phase division, but also there is another disadvantage in that if the boundaries of the detection positions in the higher-order position detector are not in coincidence with the boundaries of the detection ranges in the high-resolution detector with a greater degree of accuracy than the accuracy required for the position detection, errors are caused in the detection data at these boundary portions.

SUMMARY OF THE INVENTION

In view of the foregoing deficiencies in the prior art, it is an object of the present invention to provide an absolute position detecting method and apparatus capable of ensuring a high-resolution and high-accuracy absolute position detection and preventing the occurrence of any detection error even if the relative positional accuracy of binary code patterns of varying orders or positions is comparatively low.

To accomplish the above object, in accordance with a first aspect of the invention there is thus provided a method so designed that a pair of detection signals having a 90-degree phase difference therebetween are produced for each of a plurality of binary code patterns of varying orders, and 2-bit position data is produced for each of the detection positions of the binary code patterns of varying orders in accordance with the different phase detection signals, thus comparing the lower-order and higher-order data in each of adjacent pairs of the position data to correct the higher-order position data and thereby detecting an absolute position.

In accordance with this method, the use of a plurality of binary code patterns of varying orders ensures the detection of an absolute position with a high degree of accuracy, and also 2-bit position data is produced for each of the detection positions of the binary code patterns of varying orders so that the respective associated higher-order and lower-order position data are compared and the higher-order position data are successively corrected on the basis of the corresponding lower-order position data, thereby ensuring the detection of a position completely free of error by simply making the relative positional accuracy of the respective binary code patterns less than one fourth of their pattern pitches and easily ensuring a higher resolution.

In accordance with a second aspect of the invention, there is provided an absolute position detecting apparatus including a code disc having formed thereon a plurality of binary code patterns of varying orders for absolute position detecting purposes, a mask formed with a plurality of first slits each corresponding to one of the binary code patterns of varying orders and a plurality of second slits which are out of phase with the first slits by 90 degrees, and a light detector arranged to face the first and second slits.

In accordance with this apparatus, the previously mentioned absolute position detecting method of this invention can be performed with a high response inexpensively and without the provision of any complicated signal processing circuits by the simple apparatus including the code disc formed with the binary code patterns with the previously mentioned accuracy, the mask formed with the two kinds of slits having a 90-degree phase difference therebetween and the light detector.

In accordance with a third aspect of the invention, there is provided a method comprising obtaining detection data for a plurality of higher order patterns in the form of Gray code patterns, obtaining detection data for a plurality of lower order patterns in the form of pure binary code patterns arranged to overlap the higher order patterns by one order in the same manner as the method of the first aspect, converting the detection data obtained from the Gray code patterns and the detection data obtained from the pure binary code patterns to respective binary number data, and correcting the detection data obtained from the Gray code patterns according to the equality or unequality of the overlapping places of the two detection data, thereby detecting an absolute position.

In accordance with this method, while the detection of an absolute position is effected by using the Gray code patterns, the pitches of the patterns are so large that the detection accuracy of all the higher order patterns can be easily adjusted to any given accuracy and also the production of a pair of detection signals having a 90-degree phase difference as in the case of applying the detection method of the first aspect has the effect of preventing inconvenience of increasing the slit spacing of the mask and hence the size of the mask and correspondingly decreasing the number of light detectors, thereby reducing the cost of the necessary construction. In addition, as regards the detection data from the lower order patterns by the method of the first aspect and the detection data from the higher-order Gray code patterns, the overlapping order pattern is provided and the two detection data are converted to binary number data thus correcting the higher-order detection data in accordance with the equality or unequality of the overlapping places and thereby concatenating the two data without any error to detect an absolute position without causing any error.

In accordance with a fourth aspect of the invention, there is provided a method so designed that an absolute position is detected by using a plurality of binary code patterns of varying orders in the same manner as the first aspect, and also incremental position signals are obtained from the lowest-order binary code pattern as occasion demands whereby an absolute position is detected by suitably effecting the switching between the absolute position detection and the position detection by the incremental position signals as desired.

In accordance with this method, the incremental position detection obtained from the lowest-order binary code pattern is combined so that the detection of a position is effected incrementally from the detected absolute position serving as a reference, thereby ensuring a high speed response that suits the position detection during the rotation at high speeds.

DESCRIPTION OF THE PREFERRED EMBODIMENTS

Figure 3:
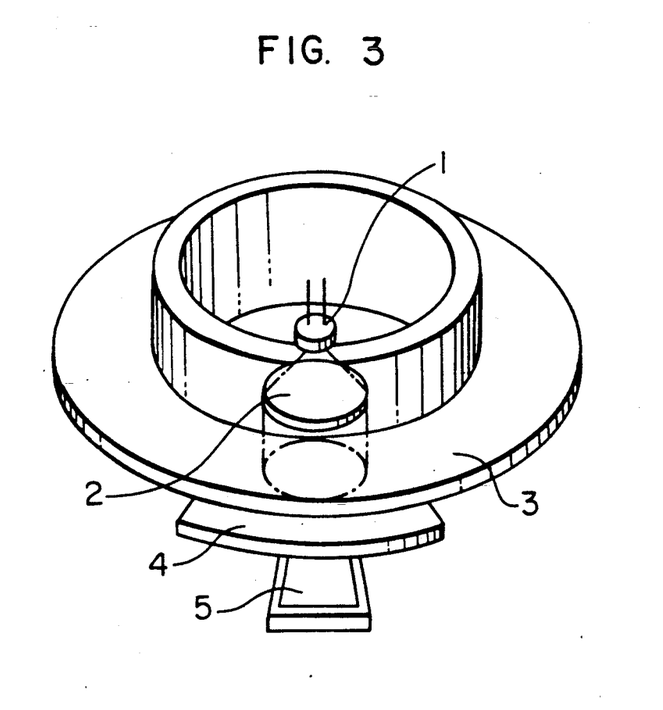
FIG. 3 is a perspective view showing schematically the overall construction of the embodiment.

Referring to FIG. 3 showing the overall construction of an absolute position detecting apparatus, numeral 1 designates a laser diode, 2 a collimating lens, 3 a circular code plate mounted on a rotating body, 4 a mask, and 5 a light detector.

Figure 1:
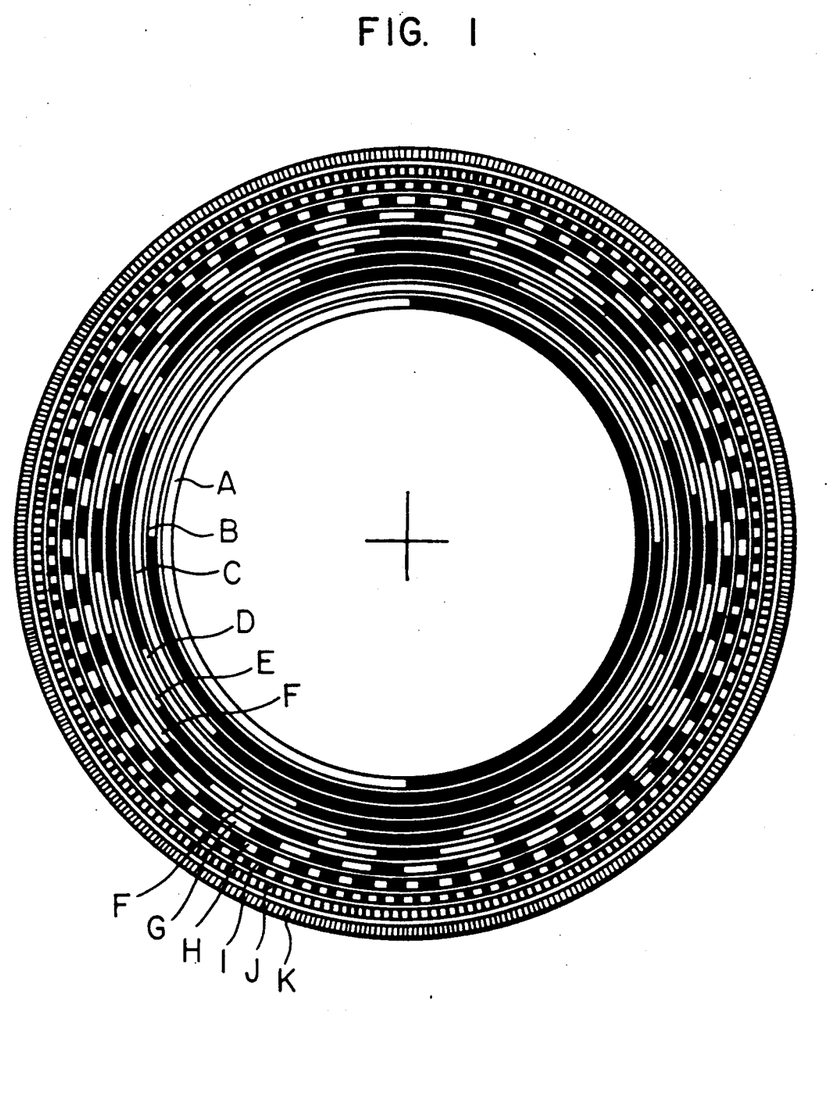
FIG. 1 is a front view of the code disc used in an absolute position detecting apparatus according to an embodiment of the invention.

As shown in FIG. 1, the code plate 3 is formed with 11 binary code patterns circumferentially arranged side by side in the radial direction to detect an angular position of the rotating body with a high resolution. Of these binary code patterns, the higher order or position patterns of greater pattern pitches are arranged on the inner side radially and the lower order or position patterns of smaller pattern pitches are arranged on the outer longer-perimeter side radially so as to facilitate the formation of the patterns having a higher resolution. The six higher-order binary code patterns A to F are in the form of Gray code patterns and the six lower-order binary code patterns F to K are in the form of pure binary code patterns. The demarcating binary code pattern F is in common to the two pattern groups. In other words, the 11 binary code patterns constitute 11 concentric code tracks A-K, with the highest order track being the innermost one and the lowest order one being the outermost one. The actual angular position of the code disc or plate 3 can be determined from the instantaneous binary states of several code tracks or patterns A-K.

It is to be noted that of these binary code patterns, those of the greater pattern pitches are made of a one-dimensional Fresnel zone plate so that the transmitted light through the binary code patterns made of the Fresnel zone plate is condensed to the focal point of the Fresnel zone plate, and the mask 4 is arranged at a position spaced apart from the code plate 3 by a distance corresponding to this focal point. Also, similarly the lower-order binary code patterns of the smaller pattern pitches are arranged in such a manner that the light and dark bands or fringes by the Fraunhofer diffraction patterns of these patterns are projected onto the mask 4.

Figure 2:
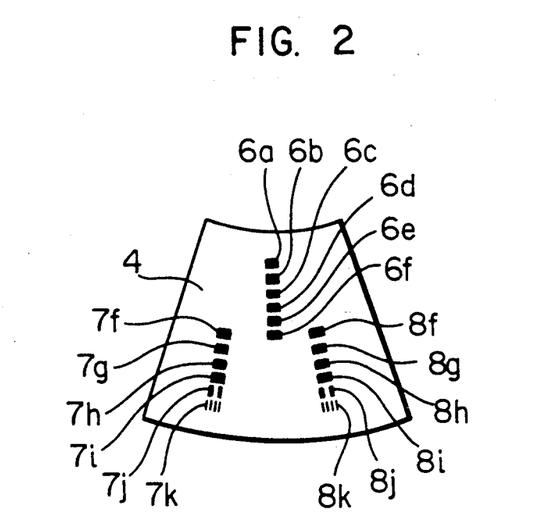
FIG. 2 is a front view of the mask used in the embodiment of FIG. 1.

As shown in FIG. 2, the mask 4 is formed with slits 6a to 6f corresponding to the Gray code patterns A to F, respectively, and first slits 7f to 7k and second slits 8f to 8k which are each corresponding to the pure binary code patterns F to K, respectively, and which are out of phase with each other by 90 degrees. Also, it is arranged so that when the condensed projected images of the binary coded patterns A to K on the mask 4 coincide with the slits 6a to 6f, 7f to 7k and 8f to 8k, signals are generated from the light sensing elements provided in correspondence to these slits in the light detector 5.

Figure 4A:
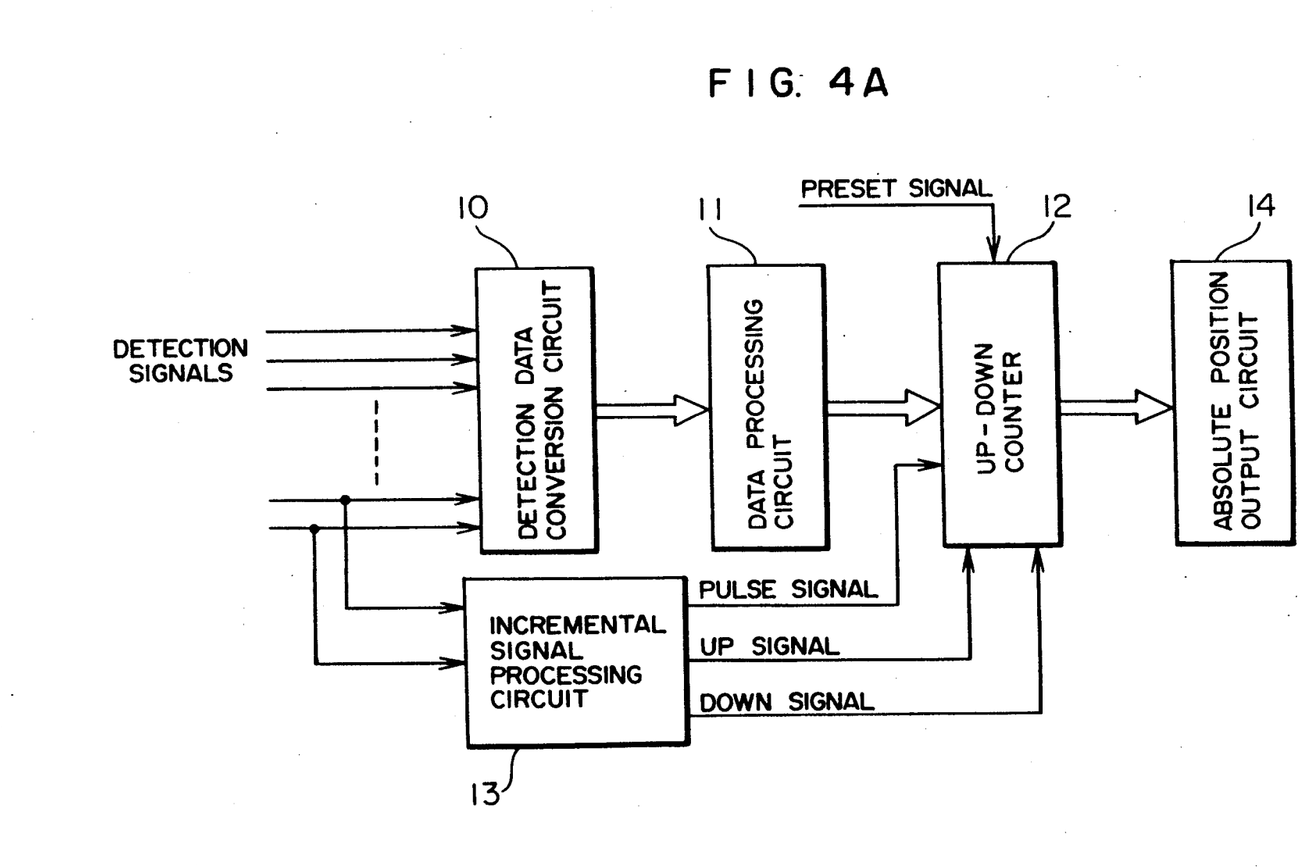
FIG. 4A is a block diagram of the data processing unit used in the embodiment.

As shown in FIG. 4A, the signals generated from the light sensing elements of the light detector 5 are applied to a detection data conversion circuit 10 where they are converted to the corresponding binary number data and then the binary number data are applied to a data processing circuit 11 where they are subjected to the desired data processing as will be described later. The resulting absolute position data in binary number form is applied to an absolute position output circuit 14 through an up-down counter 12 and the resulting decimal-number absolute position data is outputted to a display unit or the like as occasion demands. Also, of the detection signals, the detection signals produced by the lowest-order binary code pattern K and the corresponding first and second slits 7k and 8k are applied to an incremental signal processing circuit 13 so that pulse signals corresponding to the amounts of changes in the detection signals and up and down signals corresponding to the direction of the changes are applied to the up-down counter 12. Then, when a preset signal is applied to the up-down counter 12, the binary-number absolute position data held in the data processing circuit 11 is applied and preset in the up-down counter 12 and thereafter the data in the up-down counter 12 is varied in response to the input signals from the incremental signal processing circuit 13 and the corresponding absolute position data is generated from the absolute position output circuit 14.

It is to be noted that alternatively the binary-number absolute position data may be directly applied to the absolute position output circuit 14 from the data processing circuit 11 and not through the up-down counter 12, thereby generating the absolute position data.

With the construction described above, the operation of the absolute position detecting apparatus will now be described.

The light emitted from the light emitting surface of the laser diode 1 is converted to a collimated light beam by the collimating lens 2 and it is projected as a coherent collimated light beam onto the code plate 3. The projected light beam is transmitted through the binary code patterns A to K formed on the code plate 3 but shut off by the other portions and the transmitted light beam illuminates the mask 4. Then, when the projection images of the binary code patterns A to K coincide with the slits 6a to 6f, 7f to 7k and 8f to 8k formed on the mask 4 in correspondence to the position of the code plate 3, detection signals are applied to the detection data conversion circuit 10 from the light sensing elements of the light detector 5.

Figure 5:
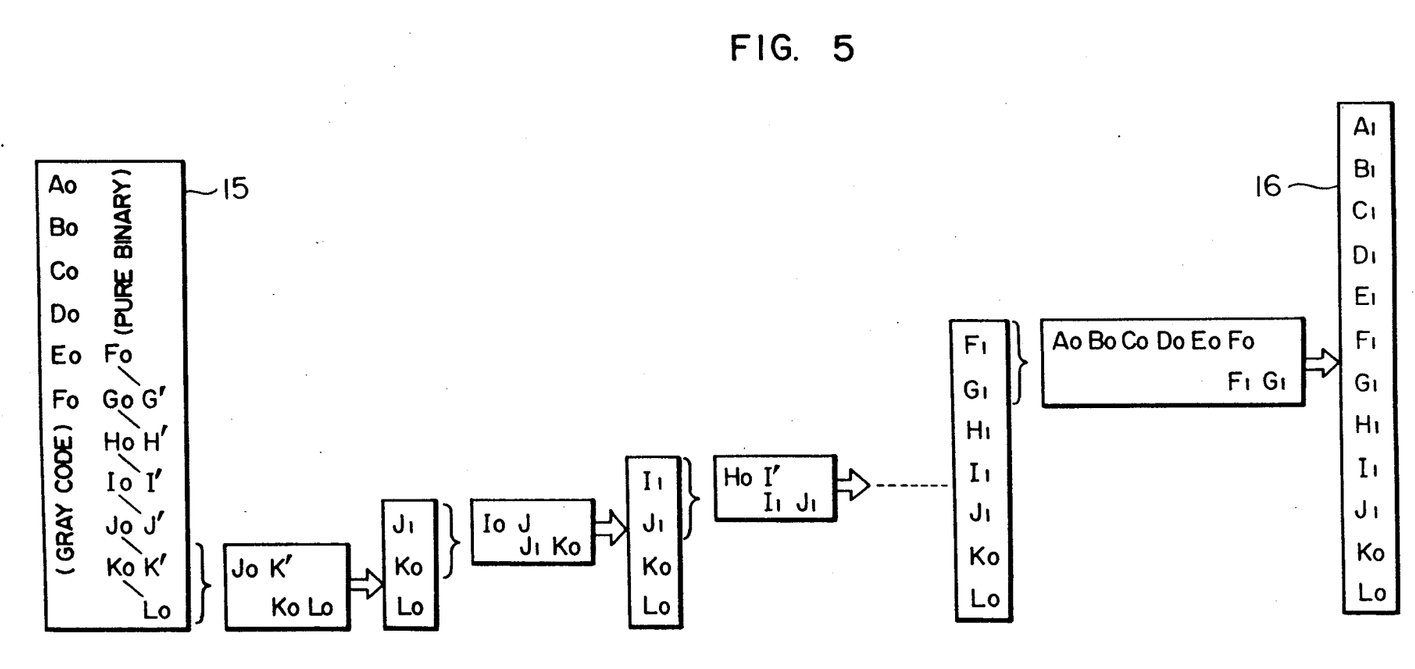
FIG. 5 is a diagram useful for explaining the procedure of a data processing method.

As in the case of detection data shown in block 15 in FIG. 5, the detection signals from the Gray code patterns A to F are converted to a group of position indicating data $A_0$ to $F_0$ forming a 6-places (6-digits) binary number by the known method in the detection data conversion circuit 10. Thus the 6-places binary data $A_0$ to $F_0$ represent the signals generated from slits 6a–6f.

Figure 6:
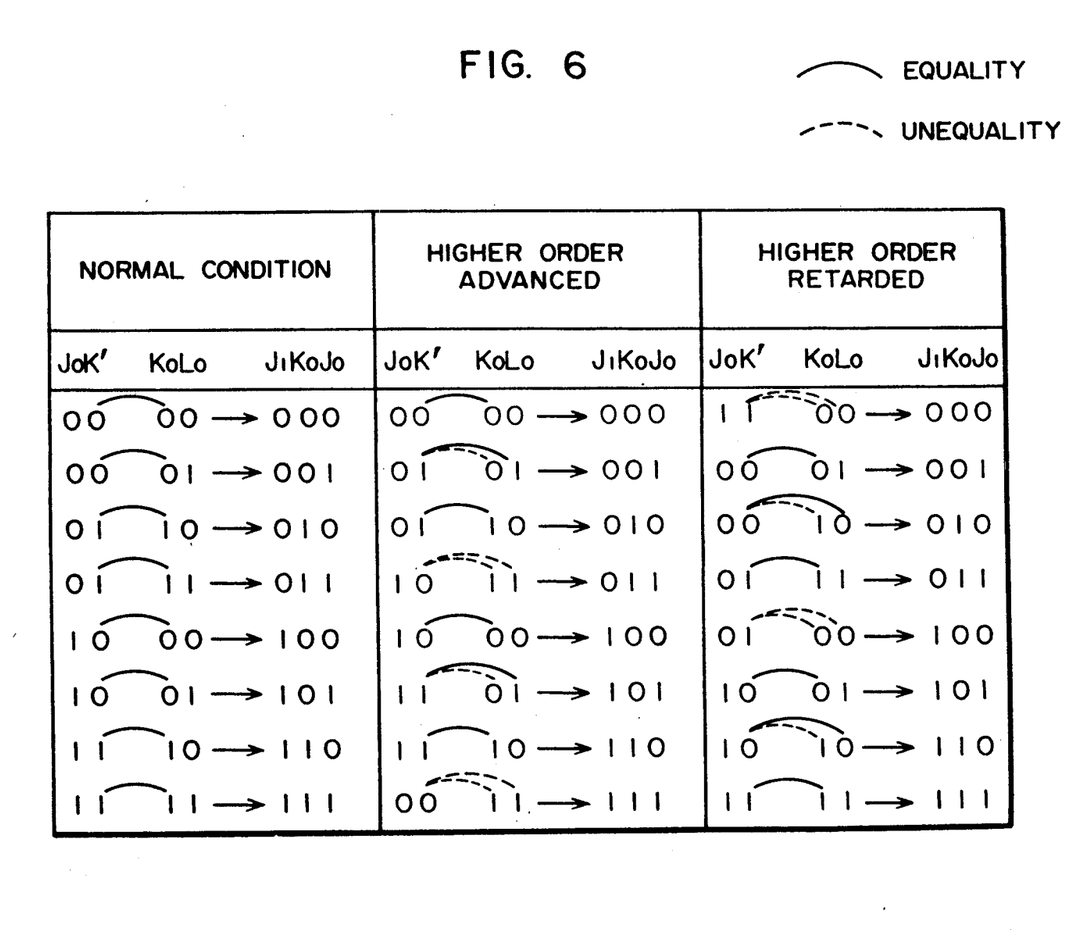
FIG. 6 is a diagram useful for explaining the logic of the data processing.
Figure 7:
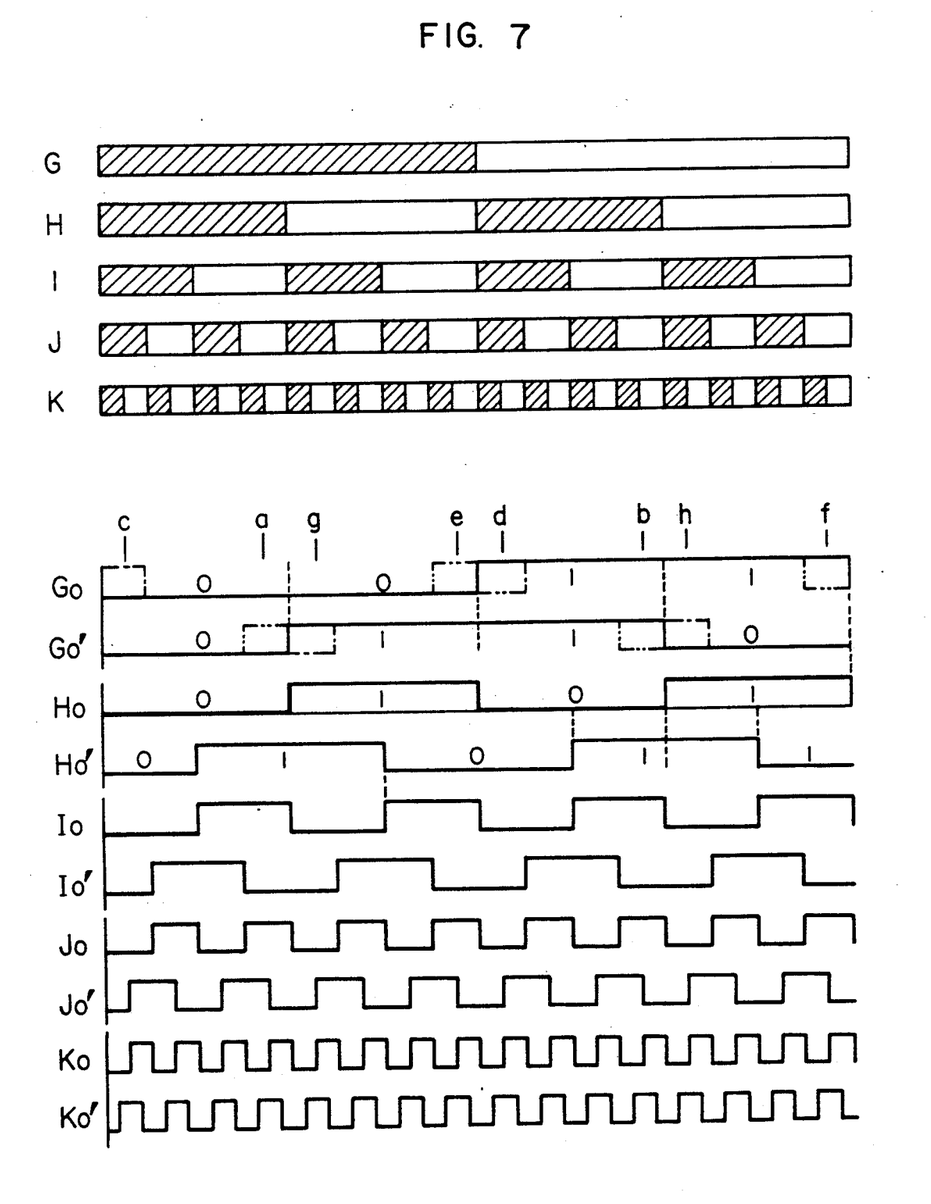
FIG. 7 is a diagram for explaining the pure binary code patterns and the resulting detection data used in another data processing method.

Also, the detection signals from the pure binary code patterns F to K are converted in such a manner that the pairs of signals respectively generated from the first and second slits 7f and 8f, 7g and 8g, ..., 7k and 8k formed in correspondence to the binary code patterns F to K, respectively, are converted to 2-places (2-digits) binary-number position indicating data $F_0G'$, $G_0H'$, ..., $J_0K'$ and $K_0L_0$, respectively. As will be apparent from the discussion below, $G_0$ and $G'$ should be equivalent provided there is not improper positional correspondence between the adjacent code patterns, i.e., where there is not leading or lagging condition as shown in the middle and right-hand columns of FIG. 6, and likewise the following data pairs should be the same: data $H_0$ and $H'$, ..., $J_0$ and $J'$ and $K_0$ and $K'$ respectively. It should be noted that, as will be apparent from the discussion below, data $K'$, e.g., is produced by a logical operation performed on data $J_0$ and $J_0'$ (i.e., $J_0 \oplus J_0' \to K'$). This logical operation is the "exclusive-or" operation. More specifically, in accordance, for example, with the pair of different phase detection signals $G_0$ and $G_0'$ provided by the binary code pattern G and the first and second slits 7g and 8g which change to either of 1 and 0, as shown in FIG. 7, position data generated from slits 7g and 8g corresponding to a fourfold division of the pattern pitch, e.g., 00, 01, 11 and 10 are produced from the combinations of the two states of data generated from slits 7g and 8g, and to obtain position data corresponding to $G_0H'$, the exclusive-OR operation is performed on $G_0$ and $G_0'$; of data 00, 01, 11 and 10, data 11 and 10 are then changed via the Exclusive-OR operation to 10 and 11, respectively, thereby performing a conversion to a binary number data such as $G_0$ defined by the upper bit and $H_0$ by the lower bit. In other words, data 11 and 10 represent $G_0$ and $H'$. Of course, $H'$ and $H_0$ constitute overlapping data and are the same as shown in FIG. 7. It is to be noted that in the position data shown in the block 15, $G_0$ and $G'$, $H_0$ and $H'$, ......, $K_0$ and $K'$ respectively show the same-digit-place data, which are hereinbelow called the "overlapping data". Then, these binary-number position data are applied to the data processing circuit 11 so that the associated lower order position data and higher order position data are compared and the higher order position data are corrected in accordance with the equality or non-equality in the overlapping data. This correcting process is performed on the successive higher order position data thereby obtaining a group of position data $F_1G_1H_1I_1J_1K_0L_0$ in binary number form is obtained.

Figure 4B:
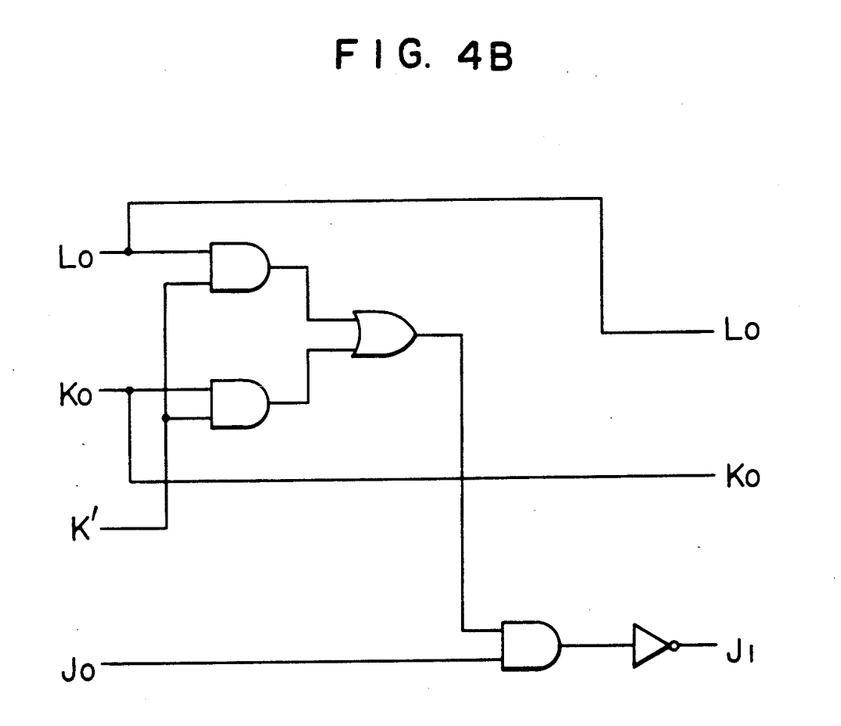
FIG. 4B is a logic circuit example partially of its data processing circuit.

Now, the data processing of the lowermost order position data $K_0L_0$ and the next higher order position data $J_0$ and $K'$ will be explained in detail by way of example. Using the lower position data $K_0L_0$ as a basis, on the basis of the fact that the data $K_0$ and $K'$ are of the same digit place and constitute overlapping data, the data $J_0$ is corrected in accordance with the equality or non-equality of $K_0$ and $K'$ (see FIG. 4B) to obtain the proper lower three-digits position data $J_1K_0L_0$ which is free of error. Where the higher order position data and the lower order position data are in the proper correspondence, as shown in the left column of FIG. 6, the overlapping data $K'$ and $K_0$ are all in coincidence and therefore it is only necessary to select $J_0$ as such as $J_1$. On the other and, where the higher binary code pattern J is formed to lead the lower binary code pattern K or where the binary number data $J_0K'$ converted from the higher pattern J is converted in advance of the data $K_0L_0$ converted from the lower pattern K, as shown in the middle column of FIG. 6, the higher position data $J_0K'$ leads the data $K_0L_0$. Therefore, a comparison is made between the data $K'$ and $K_0$ and between the data $K'$ and $I_0$ so that if $K' \neq K_0$ and $K' \neq L_0$, the data $J_0$ is just inverted to become $J_1$. On the contrary, here the higher binary code pattern J is formed to lag behind the lower binary code pattern K or where the binary number data $J_0K'$ converted from the higher pattern J is converted to lag behind the binary data $K_0L_0$ converted from the lower pattern K, as shown in the right column of FIG. 6, the higher position data lags so that in this case the data $J_0$ is also inverted to become $J_1$ in the same manner as when the previously mentioned conditions are satisfied. FIG. 4B shows a logic circuit example of part of the data processing circuit, which is to carry out the above data correction.

Then, in accordance with the binary-number position data $F_1G_1H_1I_1J_1K_0L_0$ from the pure binary code patterns, as obtained by the above-mentioned data processing, the binary-number position data $A_0B_0C_0D_0E_0F_0$ obtained from the Gray code patterns is corrected. Also, in this case $F_0$ and $F_1$ represent the overlapping data so that if $F_0 \neq F_1$ and $F_0 \neq G_1$, the data $E_0$ is inverted to become $E_1$. If data of the higher order digit places than $E_1$ is affected by the inverting of $E_0$, the successive inversion of $D_0 \ldots \ldots A_0$ is made to result in a data $A_1B_1C_1D_1E_1$ and thus finally a binary-number detection data 16 corresponding to the absolute position of the code plate 13 or $A_1B_1C_1D_1E_1F_1G_1H_1I_1J_1K_0L_0$ is obtained. Thereafter, the binary-number data is converted to the ordinary decimal number data by the absolute position output circuit 14 and it is then displayed as the absolute position data. The foregoing data processing based on the equality or unequality of the overlapping data can be performed by the use of a hardware data processing circuit. However, instead of using such hardware data processing circuit, it is possible to use a processing circuit designed so that a sequence of binary digit values of twice digit places (character positions) is produced as a series of address data by serially arranging two binary digit values produced from each pair of detection signals and position data corresponding to all the possible address data are stored in an ROM whereby the position data corresponding to the detection data is outputted directly from the ROM on the basis of the sequence of binary digit values corresponding to the detection data, thereby improving the high response characteristic. In addition, instead of performing the hardware inversion processing, when the foregoing inverting conditions are satisfied, the binary number (value) position data produced by higher order patterns of the Gray code patterns are handled as a numeric string and the data processing is effected by software adding to or subtracting 1 from the numeric string. In this case, 1 is subtracted when the higher position data leads and 1 is added when it lags. The determination of the lead and lag is effected by comparing the overlapping data in the higher position data with data of digit-place beneath the overlapping-data digit place in the binary number position data produced by the pure binary code so that the lead is determined when numeric value of the compared overlapping data is smaller than that in the lower position data and the lag is determined when it is greater.

Where data processing is effected in a hardware manner thus requiring time more or less and simultaneously a high speed response is required, as in the case of the embodiment of FIG. 4, it is possible to detect the resulting absolute position as a binary-number detection data shown in block 16 upon the connection to the power source and also to apply a preset signal to the up-down counter 12 to take in the detected data whereby the up-down counter 12 is operated by the signals from the incremental signal processing circuit 13 to detect an absolute position at a high speed. Also, by applying a preset signal to the updown counter 12 at suitable intervals to take in detection data 16, it is possible to correct the data in the up-down counter 12 and thereby prevent the accumulation of errors.

Further, as occasion demands, detection of an absolute position may be effected by applying detection data shown in block 16 to the absolute position output circuit 14 and incremental position detection data may be used for speed detecting purposes. In this case, while the first and second slits $7k$ and $8k$ of the mask 4 must be inclined slightly with respect to the lowest binary code pattern K to produce sinusoidal detection signals, data free of errors can be obtained even if the relative positional accuracy of the binary code patterns A to J is not high and therefore the requirement can be met without any difficulty.

Also, by virtue of the fact that the relative positional accuracy of the binary code patterns A to K need not be so high, no difficulty will be caused even if the lower binary code patterns having the smaller pattern pitches are arranged on the outer side radially and the higher binary code patterns having the greater slit widths and tending to cause detection errors are arranged on the inner side radially where the perimeters are short to cause errors considerably, and therefore a higher resolution is made possible by arranging the lower patterns on the outer side where the perimeters are long.

Figure 8:
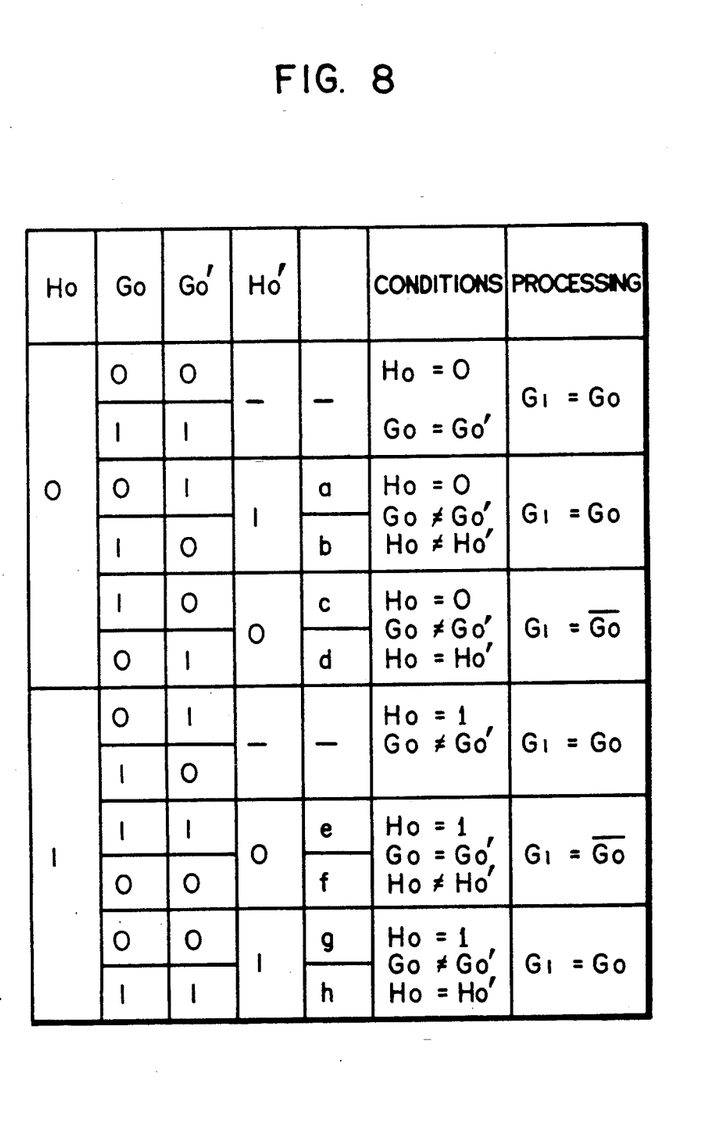
FIG. 8 is a diagram useful for explaining the logic of this data processing.

While the above-described embodiment has shown a case in which all the detection data are processed in the form of binary number data, these data need not always be converted to binary numbers. One such example will now be described with reference to FIGS. 7 and 8. FIG. 7 shows the binary code patterns G to K and the resulting detection signals having a 90-degree phase difference therebetween, i.e., $G_0, G_0'; H_0, H_0'; \ldots \ldots K_0, K_0'$. The description will now be made by way of example with reference to a case in which the detection data $G_0$ is corrected on the basis of the detection signals $H_0$ and $H_0'$ to establish a position data $G_1$. In the Figure, the two-dot-chain lines indicate the phase-advanced higher detection data and the single-dot-chain lines indicate the retarded ones. In FIGS. 7 and 8, if $H_0 = 0$, in the normal condition $G_0 = G_0'$ and therefore the detection signal $G_0$ is used as such as the position data $G_1$. On the other hand, in the advanced or retarded condition, the detection of a position a, b/c, d results in $G_0 \neq G_0'$ so that if $H_0 \neq H_0'$ as at the position a or b, then $G_0$ is selected as such as $G_1$, whereas if $H_0 = H_0'$ as at the position c or d, then $G_0$ is inverted and selected as $G_1$. In the like manner, when $H_0 = 1$, in the normal condition $G_0 = G_0'$ and thus $G_0$ is selected as such as $G_1$. On the other hand, in the advanced or retarded condition the detection of a position e, f, g or h results in $G_0 = G_0'$ so that it is necessary that $G_0$ is inverted and selected as $G_1$ when $H_0 \neq H_0'$, whereas $G_0$ is selected as such as $G_1$ when $H_0 = H_0'$. By using such logics, it is possible to directly process the position data.

Of course, the invention is not intended to be limited to the above-described embodiments and various changes and modifications can be made thereto. Thus, the invention is defined by the appended claims.

We claim:

1. In an absolute encoder for detecting the absolute position of a movable object be detecting binary code patterns arranged on a code plate attached to the movable object, an absolute position detecting method comprising the steps of:

(a) generating a pair of periodic detection signals having a 90-degree phase difference therebetween for each of a plurality of pure binary code patterns of varying orders, each order representing a different binary code pattern pitch, said binary code patterns being arranged in hierarchical order from higher to lower orders;

(b) producing first two-bit binary position data for each position of the pure binary code patterns based on said pair of periodic detection signals;

(c) performing a logical operation on said first two-bit binary position data of at least one of said pure binary code patterns to provide converted two-bit binary position data comprising one bit of said first two-bit binary position data of said at least one of said pure binary code patterns and an overlapping data bit which, if proper positional correspondence exists between said at least one of said pure binary code patterns and an adjacent next lower order one of said pure binary code patterns, is the same as one bit of said adjacent next lower order one of said pure binary code patterns;

(d) making an equality/non-equality comparison between said overlapping data bit and said one bit of said adjacent next lower order one of said pure binary code patterns; and (e) responsive to a non-equality comparison result in step (d), correcting the content of said first two-bit binary position data of said at least one of said pure binary code patterns.

2. An absolute position detecting apparatus comprising:

a code plate formed with a plurality of absolute position detecting binary code patterns;

a mask including a plurality of first slits respectively corresponding to said binary code patterns of varying positions, and a plurality of second slits which are out of phase with said first slits by 90 degrees; and light detector means arranged to face each of said first and second slits.

3. An absolute position detecting apparatus according to claim 2, wherein said code plate is circular in shape, and wherein a higher position binary code pattern is positioned radially on the inner side of a lower position binary code pattern in each of adjacent pairs of said binary code patterns.

4. In an absolute encoder for detecting absolute position by detecting code patterns of varying orders, each order representing a different binary code pattern pitch, an absolute position detecting method comprising the steps of:

obtaining absolute position detection data for a plurality of high order position patterns in the form of Gray code patterns;

obtaining a pair of period detection signals having a 90-degree phase difference therebetween for each of a plurality of lower order position patterns in the form of pure binary code patterns arranged to overlap said higher order position patterns by one position pattern;

producing from said periodic detection signals 2-bit binary position data for each character position of said lower order position binary code patterns;

making a comparison between lower order position data and higher order position data in each of adjacent pairs of said 2-bit position data and correcting the content of the higher order position data, based on a result of said comparison, to obtain detection data; and converting the detection data obtained from said Gray code patterns and the detection data obtained from said pure binary code patterns respectively to binary number data to selectively correct the detection data obtained from said Gray code patterns in accordance with the equality or unequality of overlapping data of said detection data obtained from said Gray code patterns and said detection data obtained from said pure binary code patterns, thereby detecting an absolute position.

5. In an absolute encoder for detecting absolute position of by detecting binary code patterns of varying orders, each order representing a different binary code pattern pitch, an absolute position detecting method comprising the steps of:

generating a pair of periodic detection signals having a 90-degree phase difference therebetween for each of a plurality of pure binary code patterns of varying orders;

(b) producing from said periodic detection signals 2-bit binary position data for each character position of said pure binary code patterns;

making a comparison between lower order position data and higher order position data in each of adjacent pairs of said 2-bit position data and correcting the content of the higher position data based on a result of said comparison, thereby detecting an absolute position;

generating incremental position signals from the lowest order position pattern of said pure binary code patterns; and effecting switching between absolute position detection and position detection employing said incremental position signals thereby detecting an absolute position.

6. In an absolute encoder for detecting absolute position of by detecting binary code patterns of plural character positions, an absolute position detecting method comprising the steps of:

generating a pair of periodic detection signals having a 90-degree phase difference therebetween for each of said plural character positions of pure binary code patterns;

producing from said periodic detection signals binary values of 2 bits for each of the character positions of said pure binary code patterns;

performing a comparison of values of 2 bits of a lower character position and values of a lower bit of higher order character position of each pair of adjacent character positions of said plural character positions and correcting the binary value of a higher bit of the respective higher order character position sequentially based on a result of said comparison, thereby producing a sequence of binary values corresponding to said binary code pattern.

7. In an absolute encoder for detecting an absolute position by detecting binary code patterns of plural character positions of higher and lower orders, each order representing a different binary code pattern pitch, an absolute position detecting method comprising the steps of:

producing a first sequence of binary values representative of Gray code patterns for the higher order character positions;

producing pure binary code patterns for the lower order character positions including the lowest character position of said higher order character positions and producing a pair of periodic detection signals having a 90-degree phase difference therebetween in order to produce binary values of 2 bits therefrom for each of the lower order character positions of said pure binary code patterns;

performing a first comparison of a binary value of a lower bit of an upper character position and binary values of 2 bits of a lower character position of each pair of adjacent character positions and correcting a binary value of an upper bit of the respective upper character position sequentially based on a result of said first comparison, thereby producing a second sequence of binary values corresponding to said pure binary code patterns; and performing a second comparison of a binary value of the lowest character position of said first sequence and binary values of uppermost and next-lower character positions of said second sequence of binary values and correcting said first sequence of binary values based on a result of said second comparison, to detect the absolute position.

8. In an absolute encoder for detecting an absolute position of by detecting binary code patterns of plural character positions of higher and lower orders, an absolute position detecting method comprising the steps of:

producing a pair of periodic detection signals having a 90-degree phase difference therebetween in order to produce therefrom binary values of 2 bits for each of said plural character positions of pure binary code patterns;

performing a comparison of a binary value of a lower bit of an upper character position and the binary value of 2 bits of a lower character position of each pair of adjacent character positions and correcting a binary value of an upper bit of the respective upper character position sequentially based on a result of said comparison, thereby producing a sequence of binary values corresponding to said pure binary code patterns in order to detect the absolute position;

producing incremental position signals form the lowest character position of said binary code patterns to provide an alternative detection of the absolute position; and selectively switching as desired between production of said sequence of binary values and production of said incremental position signals.

9. In an absolute encoder for detecting an absolute position of by detecting binary code patterns of plural character positions, an absolute position detecting method comprising the steps of:

producing a pair of periodic detection signals having a 90-degree phase difference therebetween in order to produce therefrom binary values of 2 bits for each of said plural character positions of pure binary code patterns; and performing a comparison of binary values of 2 bits of upper and lower character position of each pair of adjacent character positions and correcting a binary value of a upper bit of the respective upper character position sequentially based on a result of said comparison, thereby producing a sequence of binary values corresponding to said pure binary code patterns.

10. An absolute encoder for detecting an absolute position by detecting binary code patterns of plural character positions of higher and lower orders, said encoder comprising means for detecting absolute position comprising:

means for producing a first sequence of binary values in the form of Gray code patterns for the higher order character positions;

means for producing pure binary code patterns for the lower order character positions including the lowest character position of said higher order character positions and producing a pair of periodic detection signals having a 90-degree phase difference therebetween in order to produce binary values of 2 bits therefrom for each of the lower order character positions of said pure binary code patterns;

means for performing a comparison of binary values of 2 bits of a lower character position and those of upper character position of each pair of adjacent character positions and correcting a binary value of an upper bit of the respective upper character position sequentially based on a result of said first comparison, thereby producing a second sequence of binary values corresponding to said pure binary code patterns; and means for performing a second comparison of a binary value of the lowest character position of said first sequence of binary values and binary values of uppermost and next lower character positions of said second sequence of binary values and correcting binary values of said first sequence based on a result of said second comparison to detect the absolute position.

11. An absolute encoder for detecting an absolute position by detecting binary code patterns of plural character positions, said encoder comprising means for detecting absolute position comprising:

means for producing a pair of periodic detection signals having a 90-degree phase difference therebetween in order to produce therefrom binary values of 2 bits for each of said plural character positions of pure binary code patterns;

means for performing a comparison of binary values of 2 bits of lower character position and those of upper character position of each pair of adjacent character positions and correcting a binary value of upper bit of the respective upper character position sequentially based on a result of said comparison, thereby producing a sequence of binary values corresponding to said pure binary code patterns in order to detect the absolute position;

means for producing incremental position signals from the lowest character position of said binary code patterns to provide an alternative detection of absolute position; and means for selectively switching as desired between producing of said sequence of binary values and production of said incremental position signals.

12. An apparatus for detecting an absolute position comprising:

means establishing pure binary code patterns of plural character positions;

first means for producing a pair of periodic signals having a 90-degree phase difference therebetween for each of said plural character positions of the pure binary code patterns;

second means for producing binary values of 2 bits for each of said binary code patterns from the respective periodic signals;

data processing means including memory means storing correction data to be addressed by sequences of produced binary values of twice the character positions of said pure binary code patterns, and means for reading out correction data from said memory means with an address sequence of binary values produced corresponding to a current absolute position to thereby produce a second sequence of binary values representative of a corresponding pure binary code pattern for the detection of the current absolute position.

13. An apparatus for detecting an absolute position comprising:

means establishing Gray code patterns of higher order character positions and pure binary code patterns of lower order character positions including a lowest character position of said higher order character positions;

first means for producing a first sequence of binary values corresponding to said Gray code patterns and producing a pair of periodic detection signals having a 90-degree phase difference therebetween in order to produce binary values of 2 bits therefrom for each character position of the said pure binary code patterns;

data processing means including memory means storing correction data to be addressed by sequences of produced binary values of twice the character positions of said pure binary code patterns;

means for reading out correction data from said memory means with an address sequence of binary values produced corresponding to a current absolute position to thereby produce a second sequence of binary values representative of a corresponding pure binary code pattern, and means for performing a comparison of a binary value of the lowest character position of said first sequence of binary values and binary values of the uppermost and next lower character positions of said second sequence of binary values and for correcting said first sequence of binary values to detect the absolute position based on a result of said comparison.

14. An apparatus for detecting an absolute position comprising:

means establishing pure binary code patterns of plural character positions;

first means for producing a pair of periodic detection signals having a 90-degree phase difference therebetween in order to produce therefrom binary values of 2 bits for each of said plural character positions of the pure binary code patterns;

data processing means including memory means storing correction data to be addressed by sequences of produced binary values of twice the character positions of said pure binary code patterns;

means for reading out correction data from said memory means with an address sequence of binary values produced corresponding to a current absolute position to thereby produce the second sequence of binary values representative of a corresponding pure binary code patterns;

means for producing the incremented position signals from the lowest character position of said binary code patterns, and means for selectively switching as desired between production of said second sequence of binary values and production of said incremental position signals.

* * * * *